(12) United States Patent
Ikeguchi et al.

(10) Patent No.: US 9,211,592 B2
(45) Date of Patent: Dec. 15, 2015

(54) LUBRICANT SHEET FOR DRILLING AND METHOD OF DRILLING

(75) Inventors: Nobuyuki Ikeguchi, Tokyo (JP); Takuya Hasaki, Tokyo (JP); Shinya Komatsu, Tokyo (JP); Toshihiko Kobayashi, Tokyo (JP); Mitsuo Ejiri, Tokyo (JP)

(73) Assignee: MITSUBISHI GAS CHEMICAL COMPANY, INC., Tokyo (JP)

( * ) Notice: Subject to any disclaimer, the term of this patent is extended or adjusted under 35 U.S.C. 154(b) by 0 days.

(21) Appl. No.: 12/073,775

(22) Filed: Mar. 10, 2008

(65) Prior Publication Data

US 2008/0166565 A1 Jul. 10, 2008

Related U.S. Application Data

(60) Division of application No. 10/885,740, filed on Jul. 8, 2004, now abandoned, which is a continuation-in-part of application No. 10/765,041, filed on Jan. 28, 2004, now abandoned.

(30) Foreign Application Priority Data

| Jan. 28, 2003 | (JP) | 2003-018454 |
| Apr. 8, 2003 | (JP) | 2003-103899 |
| Apr. 15, 2003 | (JP) | 2003-110686 |
| Apr. 18, 2003 | (JP) | 2003-114164 |

(51) Int. Cl.
*B23B 35/00* (2006.01)
*B32B 15/08* (2006.01)
*H05K 3/00* (2006.01)

(52) U.S. Cl.
CPC ............. *B23B 35/00* (2013.01); *B32B 15/08* (2013.01); *H05K 3/0047* (2013.01); *B23B 2250/12* (2013.01); *H05K 2203/0214* (2013.01); *H05K 2203/127* (2013.01); *H05K 2203/161* (2013.01); *Y10T 29/49124* (2015.01); *Y10T 408/03* (2015.01); *Y10T 428/24802* (2015.01); *Y10T 428/24826* (2015.01); *Y10T 428/24917* (2015.01); *Y10T 428/31504* (2015.04); *Y10T 428/31678* (2015.04)

(58) Field of Classification Search
CPC .... B23B 35/00; B23B 2250/12; B32B 15/08; H05K 3/0047; H05K 2203/0214; H05K 2203/127; H05K 2203/161; Y10T 428/24917; Y10T 428/31504; Y10T 428/31678; Y10T 29/49124; Y10T 408/03; Y10T 428/24802; Y10T 428/24826
USPC ........ 428/141, 411.1, 457; 508/100; 408/1 R, 408/56, 87; 29/829
See application file for complete search history.

(56) References Cited

U.S. PATENT DOCUMENTS

| 3,784,440 | A | * | 1/1974 | Grunwald et al. ............ 428/417 |
| 3,791,970 | A | * | 2/1974 | Tubb .............................. 508/433 |
| 3,974,674 | A | * | 8/1976 | Orozco et al. ..................... 72/42 |
| 4,188,415 | A | * | 2/1980 | Takahashi et al. ............. 427/470 |
| 4,472,494 | A | * | 9/1984 | Hallman et al. ............... 430/160 |
| 4,687,789 | A | * | 8/1987 | Gonnet et al. ................. 523/122 |
| 4,929,370 | A | * | 5/1990 | Hatch et al. .................... 508/100 |
| 4,965,073 | A | * | 10/1990 | Maruyama et al. ........... 430/292 |
| 5,221,595 | A | * | 6/1993 | Lingnau et al. ............. 430/281.1 |
| 5,645,932 | A | * | 7/1997 | Uchibori ....................... 428/347 |
| 5,786,127 | A | * | 7/1998 | Madoux et al. ............. 430/273.1 |
| 6,071,434 | A | | 6/2000 | Davis et al. |
| 6,200,074 | B1 | | 3/2001 | Miller et al. |
| 6,866,450 | B2 | | 3/2005 | Hasaki et al. |
| 2002/0051684 | A1 | | 5/2002 | Ejiri et al. |

FOREIGN PATENT DOCUMENTS

| JP | 2000-218599 | 8/2000 |
| KR | 2002-0018984 | 3/2002 |

OTHER PUBLICATIONS

Author Unknown, Jan. 4, 2013, Definition of Naphthalene Green V, Available online at Merriam-Webster Dictionary.*
Author Unknown, Jan. 4, 2013, Definition of Fuchsine, Available online at Collins English Dictionary.*

* cited by examiner

*Primary Examiner* — Maria Veronica Ewald
*Assistant Examiner* — Nathan Van Sell
(74) *Attorney, Agent, or Firm* — Wenderoth, Lind & Ponack, L.L.P.

(57) ABSTRACT

A lubricant sheet suitable for use in a process of drilling a laminate or a plastic board, comprising a metal foil or an organic film, and a lubricant resin composition layer or a primer layer and the lubricant resin composition layer, the lubricant resin composition layer or the primer layer and the lubricant resin composition layer being formed on at least one surface of the metal foil or the organic film, wherein at least one layer of the primer layer and the lubricant resin composition layer contains a colorant, and a drilling method using the above lubricant sheet.

10 Claims, No Drawings

LUBRICANT SHEET FOR DRILLING AND METHOD OF DRILLING

This is a divisional application of Ser. No. 10/885,740, filed Jul. 8, 2004 now abandoned, which is a continuation-in-part of Ser. No. 10/765,041, filed Jan. 28, 2004 now abandoned.

FIELD OF THE INVENTION

The present invention relates to a lubricant sheet for drilling which, when a hole is made in a laminate or a plastic board, is disposed on a surface of the laminate or the plastic board, and a drilling method using the above lubricant sheet for drilling. A penetration hole obtained by using the above lubricant sheet for drilling in the production of a printed wiring board is suitably used mainly as a through hole of a printed wiring board such as a semiconductor plastic package or a mother board. Further, the lubricant sheet for drilling, provided by the present invention, can be applied to other precise drilling applications, e.g., application of drilling a hard plastic board such as a spectacle lens.

PRIOR ARTS OF THE INVENTION

Conventionally, an aluminum sheet is used as an entry sheet for drilling a laminate, used for a printed wiring board, with a metal drill. In a high-density printed wiring board used for a semiconductor plastic package or the like, in recent years, the diameter of a through hole is becoming smaller and smaller and printed wiring boards having a minimum through hole diameter of 0.15 mmϕ or less are increasing. When such a small-diameter hole is made using an aluminum entry sheet alone, there are problems that the life of a drill is short, that the roughness of a hole wall is large and that hole-location accuracy is poor. For this reason, a lubricant sheet for drilling, obtained by forming a lubricant resin layer on one surface of a metal foil such as aluminum, is used for extending the life of a drill, improving the hole-location accuracy and improving the roughness of a hole wall. For example, JP-A-5-169400 publication proposes a lubricant sheet obtainable by forming a lubricant resin composition layer having a thickness of 0.1 to 3.0 mm on one surface of a metal foil. The hue of the above lubricant resin composition layer is a natural color. For this reason, when the thickness of the lubricant resin layer is small, it is difficult to distinguish both surfaces of the lubricant sheet from each other so that it is difficult to judge which surface should be brought into contact with a laminate or a plastic board. The above difficulty causes problems such as a mistake of placing the lubricant sheet reversely or a decrease in the quality of a hole. Further, when a small-diameter drill, particularly a drill having a diameter of 0.1 mm or less, is used, there arise problems that the drill is apt to break.

SUMMARY OF THE INVENTION

It is an object of the present invention to provide a lubricant sheet capable of overcoming a problem of poor hole quality caused by a mistake of placing the lubricant sheet reversely.

It is another object of the present invention to provide a lubricant sheet capable of preventing any drill breakage occurring when a small-diameter drill is used.

According to the present invention, there is provided a lubricant sheet for drilling, comprising a metal foil or an organic film, and a lubricant resin composition layer or a primer layer and the lubricant resin composition layer, the lubricant resin composition layer or the primer layer and the lubricant resin composition layer being formed on at least one surface of the metal foil or the organic film, wherein at least one layer of the primer layer and the lubricant resin composition layer contains a colorant.

According to the present invention, further, there is provided a lubricant sheet for drilling according to the above lubricant sheet, wherein the organic film has roughness of 0.5 to 15 μm on a surface thereof and a distance between convex portions of the roughness is 1 to 50 μm.

According to the present invention, furthermore, there is provided a method of drilling a laminate or a plastic board, which method comprises disposing a lubricant sheet for drilling on the laminate or the plastic board and drilling a hole from a lubricant resin composition layer side.

DETAILED DESCRIPTION OF THE INVENTION

In the present invention, the term "laminate" refers to a plastic board having an insulating layer for a printed board, and the above term includes a plastic board further having a conductor layer in addition to the insulating layer. The term "plastic board" refers to a plate-like article formed of a composition containing an organic polymer compound as a main component and includes a plate-like article which has a glass substrate or an inorganic filler.

Concerning a lubricant sheet for drilling obtained by forming a lubricant resin composition layer or a primer layer and a lubricant resin composition layer on at least one surface of a metal foil or an organic film, the present invention makes both surfaces of the lubricant sheet apparently distinguishable from each other by incorporating a colorant, preferably a nonhalogen colorant, into at least one layer of the primer layer and the lubricant resin layer and thus the present invention prevents a mistake placement of the lubricant sheet at the time of drilling. Further, the incorporation of the nonhalogen colorant can provide an environmentally friendly lubricant sheet for drilling. In addition, it is preferred to use a water-soluble resin in the lubricant resin composition, since the lubricant resin composition can be easily removed when it adheres to a laminate or a plastic board. In this case, it is also preferred to use a water-soluble colorant as the colorant.

Further, concerning a lubricant sheet obtained by forming a lubricant resin composition layer or a primer layer and a lubricant resin composition layer on at least one surface of an organic film, the present invention prevents any drill breakage and improves hole-location accuracy by providing the organic film with a roughness having a predetermined size.

Furthermore, the present invention considerably improves hole-location accuracy by controlling the size of an air bubble contained in the lubricant resin composition layer of the lubricant sheet.

The lubricant resin composition used in the lubricant sheet of the present invention can be selected from known resin compositions used for a resin composition of a lubricant sheet for drilling. Examples thereof include a water-soluble resin, a thermoplastic resin, a thermosetting resin and a mixture of a lubricant and any one of these resins, etc. These may be used alone or in combination. A lubricant resin composition containing a water-soluble resin as a main component is preferably used. The above water-soluble resin can be easily removed by washing with hot water when it remains in a penetration hole during drilling, so that a hole excellent in reliability can be obtained.

A variety of additives may be added to the lubricant resin composition. For example, a variety of organic or inorganic fillers may be added depending upon a purpose as required.

Preferable examples of the water-soluble resin used in the lubricant resin composition of the present invention include polyethylene oxide, polypropylene glycol, polypropylene oxide, polyvinyl alcohol, sodium polyacrylate, polyacrylamide, polyvinyl pyrrolidone, carboxymethyl cellulose, polytetramethylene glycol, polyether ester, etc. These may be used alone or in combination.

Preferable examples of the thermoplastic resin used in the lubricant resin composition of the present invention include polyethylene, polypropylene, polystyrene, polyester, polyethylene terephthalate, polyamide, polycarbonate, polysulfone, polyethersulfone, polyalylate, polyether ether ketone, polyphenylene sulfide, etc. These thermoplastic resins may be used alone or in combination.

Preferable examples of the thermosetting resin used in the lubricant resin composition of the present invention include a phenol resin, an epoxy resin, a melamine resin, a urea resin, an acrylic resin, an unsaturated polyester resin, a polyurethane resin, an alkyd resin, a silicon resin, a cyanate ester resin, a maleimide resin, etc. These thermosetting resins may be used alone or in combination.

Preferable examples of a water-soluble lubricant used in the lubricant resin composition of the present invention include monoethers of polyoxyethylene such as polyethylene glycol, polyoxyethylene oleyl ether, polyoxyethylene cetyl ether, polyoxyethylene stearyl ether, polyoxyethylene lauryl ether, polyoxyethylene dodecyl ether, polyoxyethylene nonyl ether and polyoxyethylene octylphenyl ether, esters of polyoxyethylene such as polyoxyethylene monolaurate, polyoxyethylene monostearate and polyoxyethylene monoolate, monoester of polyoxyethylene sorbitan, polyglycerin monostearates such as hexaglycerin monostearate and decaglycerin monostearate, a polyoxyethylene propylene block polymer, etc. These may be used alone or in combination.

Examples of a water-insoluble lubricant used in the lubricant resin composition of the present invention include amide compounds such as ethylenebisstearamide, oleic acid amide, stearic acid amide and methylenebisstearamide, fatty acid compounds such as lauric acid, stearic acid, palmitic acid and oleic acid, fatty acid ester compounds such as butyl stearate, butyl oleate and glycol laurate, aliphatic hydrocarbon compounds such as liquid paraffin and polyethylene wax, and higher aliphatic alcohols such as oleic alcohol, etc. These may be used alone or in combination.

The method of producing the lubricant sheet for drilling, provided by the present invention, by forming a lubricant resin composition layer of the above lubricant resin composition on a metal foil or an organic film is not specially limited. The above method can be selected from generally known methods. For example, there may be adopted a method in which the lubricant resin composition is kneaded with a kneader, etc., without a solvent at a high temperature, the kneaded resin composition is extruded to prepare a sheet, and the sheet is pressed on a metal foil or organic film, to produce a lubricant sheet for drilling, and a method in which the lubricant resin composition is dissolved in a solvent or water to prepare a coating composition, the coating composition is applied to a surface of a metal foil or organic film, and the applied coating composition is dried to produce a lubricant sheet for drilling. The thickness of the lubricant resin composition layer is not specially limited, while it is preferably 5 to 100 μm. The lubricant resin composition layer may be formed on each surface of the metal foil or organic film. When the resin layers are formed on both surfaces of the metal foil, for example, a hard resin for preventing burrs is disposed on a surface which is a drilling target material side and a soft resin containing a lubricant is disposed on the other surface which is a drill side. In this manner, it is possible to make the resins on both the surfaces play different roles. When the above type lubricant sheet is used, the distinguishment between both surfaces is particularly important.

When adhesion between the metal foil or the organic film and the lubricant resin composition is insufficient, a primer layer which is generally formed of a thermosetting resin or a thermoplastic resin and has a thickness of preferably 0.5 to 15 μm is formed on a metal foil or organic film surface for improving the adhesion strength. The method of forming the primer layer on the metal foil or organic film surface is not specially limited. It can be selected from known methods. For example, there may be adopted a method in which a primer resin with no solvent or a coating composition obtained by dissolving a primer resin in a solvent is applied to a metal foil or organic film surface and it was dried to form a primer layer, or a method in which the above coating composition is directly sprayed on a metal foil or organic film surface. In the present invention, when the lubricant sheet has a primer layer, it is preferred to add a colorant into the primer layer in order to apparently distinguish both surface of the lubricant sheet from each other. In this case, it is also possible to add a colorant into the lubricant resin layer, which is formed on the primer layer.

The colorant used in the present invention can be selected from generally known organic and inorganic pigments and organic and inorganic dyes. Specifically, the organic pigments include azo pigments such as lake red, hansa yellow, β-naphthol, naphthol AS, benzimidazolone, disazo yellow and pyrazolone, phthalocyanine, quinacridone, dioxazine, perylene, thioindigo, anthanthrone, isoindolin, isoindolinone, indanthrene, quinophtharone, metal complex, pyrrolopyrrole, phthalocyanine green, copper phthalocyanine blue, nickel phthalocyanine blue, aluminum phthalocyanine blue, alkali blue, sky blue, iron blue, ultramarine blue, indigo, monoazo yellow, benzimidazolone yellow and anthraquinone yellow. These colorants may be used alone or in combination for achieving an intended hue.

The organic dye is preferably an edible coloring matter. Most of the edible coloring matters are water-soluble and have an extremely low toxicity so that the edible coloring matters are preferred in view of these features. Specifically, the edible coloring matter includes yellow coloring matters, red coloring matters and blue coloring matters. The yellow coloring matters include 1H-pyrazole-3-carboxylic acid, 4,5-dihydro-5-oxy-1-(4-sulfonyl)-4-[(4-sulfonyl)azo]-trisodium salt (Yellow color No. 4), 2-naphthalenesulfonic acid, 6-hydroxy-5-[(4-sulfonyl)azo]-disodium salt (Yellow color No. 5), etc. The red coloring matters include 2,7-naphthalenedisulfonic acid, 3-hydroxy-4-[(4-sulfo-1-naphthalene)azo]-trisodium salt (Red color No. 2), spiro-[isobenzofuran-1(3H), 9'-[9H]xanthone]-3-one-3',6'-dihydroxy-2',4',5',7'-tetraioddisodium salt (Red color No. 3), 6-hydroxy-5-[(2-methoxy-5-methyl-4-sulfophenyl)azo]-2-naphthalenesulfonic acid disodium salt (Red color No. 40), 1,3-naphthalenedisulfonic acid, 7-hydroxy-8-[(4-sulfo-1-naphthalene)azo]-trisodium salt (Red color No. 102), spiro-[isobenzofuran-1(3H),9'-[9H] xanthene]-3-one-2',4',5',7'-tetrabrom-4,5,6,7-tetrachloro-3', 6'-dihydroxy-disodium salt (Red color No. 104) and spiro-[isobenzofuran-1(3H),9'-[9H]xanthene]-3-one-4,5,6,7-tetrachloro-3',6'-dihydroxy-2',4',5',7'-tetraiod-dipotassium salt (Red color No. 105), etc. The blue coloring matters include benzenemethanaminium, N-ethyl-N-[4-[[4-[ethyl [(3-sulphenyl)methyl]amino]phenyl](2-sulfophenyl)methylene]-2,5-cyclohexadiene-1-iridine]-3-sulfo-hydroxide inner salt-disodium salt (Blue color No. 1), 1H-indole-5-sulfonic acid, 2-(1,3-dihydroxy-3-oxo-5-sulfo-2H-indole-2-iridine)-2,3-dihydro-3-oxo-disodium salt, etc. These colorants may be a halogen-containing colorant or a nonhalogen colorant. In view of environment, colorants containing no halogen are preferable. Further, the colorant is preferably a water-soluble colorant, since the water-soluble colorant can be removed by washing with hot water when it remains in a hole portion. The amount of the colorant is not specially limited. The amount of the colorant in the lubricant resin composition is preferably 0.1 to 5% by weight.

The inorganic pigments include titanium oxide, etc. Of course, mixtures of the organic pigments and the inorganic pigments can be used. Further, known dyes can be used.

A combination of the lubricant resin composition and the colorant is not specially limited. Specifically, examples thereof include (1) a method in which the lubricant resin is a water-insoluble resin and the colorant is a water-soluble or water-insoluble colorant, (2) a method in which the lubricant resin is a water-soluble resin and the colorant is a water-soluble or water-insoluble colorant and (3) a method in which the lubricant resin is a mixture of water-soluble or water-insoluble resins and the colorant is a water-soluble or water-insoluble colorant.

A combination of the primer resin and the colorant is not specially limited. Specifically, examples thereof include (1) a method in which the primer resin is a water-insoluble resin and the colorant is a water-soluble or water-insoluble colorant, (2) a method in which the primer resin is a water-soluble resin and the colorant is a water-soluble or water-insoluble colorant, (3) a method in which the primer resin is a mixture of water-soluble or water-insoluble resins and the colorant is a water-soluble or water-insoluble colorant, and (4) a method in which the primer resin itself is a colored resin.

Concerning a lubricant sheet in which the lubricant resin composition layer in formed on a metal foil, a combination of a water-soluble resin and a water-soluble colorant is preferred in view of recovery and recycle of the metal foil after use. In the present invention, the term "nonhalogen" refers to a compound of which each of the content of chlorine and the content of bromine is respectively 0.09% (900 ppm) or lower according to the measurement method described in JPCA Standard (JPCA-ES-01-1999).

The method of mixing the above pigment or the dye with the lubricant resin composition or the primer resin may be a known method. As the pigment, a pigment having fine particles is used, and the pigment is dispersed or dissolved in the lubricant resin composition, the primer resin, a solvent or the like. The dye is dissolved or dispersed in a solvent and/or water and then the resultant solution or dispersion is added to the lubricant resin composition or the primer resin. Otherwise, the dye is directly dispersed or dissolved in the lubricant resin composition or the primer resin.

The metal foil on which the lubricant resin composition layer is to be formed can be selected from known metal foils used as a metal foil of a lubricant sheet for drilling. Specifically, there may be used a hard aluminum, a soft aluminum, an annealed aluminum, a high-purity aluminum, nickel, copper, etc., and alloys of these. Preferably, there is used a hard, soft or annealed aluminum foil having a thickness of 50 to 500 μm, more preferably 80 to 200 μm, or an aluminum foil which is obtained by combining these foils and has a thickness of 50 to 500 μm, more preferably 80 to 200 μm. The metal foil may be surface-treated by a primer treatment. Further, there is preferably used a metal foil whose surface is provided with a roughness of 0.5 to 3 μm by a known method such as a physical or chemical treatment.

The organic film on which the lubricant resin composition layer is to be formed is not specially limited so long as it is a polymer compound which itself can be molded into a film. Specifically, examples thereof include polyethylene terephthalate, polybutylene terephthalate, polypropylene, polyethylene, polyamide, polycarbonate, etc., and a mixture of at least two of these polymer compounds. These polymer compounds are properly selected and used, as required, depending upon a required hole-processing step in consideration of heat resistance, water-solubility, stickiness, drilling-processability, handling ability, etc. The thickness of the organic film is preferably 50 to 500 μm, more preferably 80 to 200 μm. The surface roughness degree of the organic film is as follows. The distance between convex portions is 1 to 50 μm, preferably 3 to 30 μm. Further, a roughness in depth direction is 0.5 to 15 μm, preferably 1 to 3 μm. The lubricant resin composition layer is formed on at least one surface of the above organic film having roughness. When the organic film is transparent, it is difficult to distinguish both surfaces of the lubricant film from each other, so that colorants different from each other are respectively added to the lubricant resin composition layer and the organic film.

The lubricant sheet for drilling of the present invention is disposed on at least the top surface of laminate(s) or plastic board(s) and holes are drilled from the lubricant resin composition layer side of the lubricant sheet. The laminate or the plastic board used in the above drilling is not specially limited. Specifically, examples of the laminate or the plastic board include a laminate with no copper foil, a single-side or double-side copper-clad laminate, a multiplayer board obtained by using the above copper-clad laminates, a copper-clad flexible sheet, a rigid-flex board, a polycarbonate board, an acrylic board, etc.

EFFECT OF THE INVENTION

According to the lubricant sheet for drilling, provided by the present invention, the lubricant sheet can be disposed without any mistake of distinguishment of both surfaces from each other. In regard to the lubricant sheet using a water-soluble resin, even when the resin adheres to a hole wall, the resin can be easily removed by washing with water in a subsequent step. An entry sheet having industrially high practicality can be obtained.

According to the colored lubricant sheet for drilling, provided by the present invention, the distinguishment between both surfaces thereof becomes easy, so that poor hole quality caused by a mistake of disposing the lubricant sheet reversely can be prevented.

According to the lubricant sheet for drilling in which the resin composition layer is formed on the organic film having roughness, provided by the present invention, the rate of drill breakage is improved largely and holes excellent in hole-location accuracy, etc., can be obtained.

EXAMPLES

The present invention will be explained concretely with reference to Examples and Comparative Examples hereinafter, in which "part" stands for "part by weight".

Example 1

1 part of a blue water-soluble dye (edible coloring matter blue No. 1), which did not contain a halogen, was added to 35 parts of a polyethylene oxide having a molecular weight of 500,000 and 65 parts of a polyglycerin monostearate having a molecular weight of 900. These were kneaded with a kneader at 130° C. under a nitrogen gas seal for 1 hour, to obtain a mixture having a viscosity of 160,000 poise. The mixture was passed through a heating roll at 130° C. to obtain a blue-colored sheet having a thickness of 0.05 mm.

Separately, 10 parts of a saturated polyester resin having a hydroxyl group at a terminal and having a molecular weight of 20,000 and a melt-viscosity of 800 poise (at 200° C.) and 3 parts of hexamethylene diisocyanate were dissolved in a mixed solvent of toluene/methyl ethyl ketone=3/1, to obtain a solution having a concentration of 10% by weight. The solution was applied to one surface of a hard aluminum foil having a thickness of 100 μm and the applied solution was dried at 100° C. for 1 hour, to form a primer layer having a thickness of 5 μm on the aluminum foil. The above blue-colored sheet was placed on the primer layer of the aluminum foil, and the sheet and the aluminum foil were pressed and integrated with a heating roll, to obtain a lubricant sheet for drilling, of which one surface was colored in blue (both surfaces thereof were apparently distinguishable from each other). Then, two 1.6 mm-thick bismaleimide-cyanate ester resin (BT resin) type copper-clad six-layered boards were stacked. The above lubricant sheet was disposed on the top surface of the stacked boards such that the resin composition layer of the lubricant sheet faced upward, and a 1.6 mm-thick paper phenol laminate was disposed on the lower surface of the stacked six-layered boards. Holes were made with a drill having a drill bit diameter of 0.25 mmφ at a revolution of 150,000 rpm at a feed speed of 25 μm/rev. The holes were evaluated. Table 1 shows results thereof.

Example 2

10 parts of polyethylene glycol as a lubricant was added to 200 parts of a polyvinylacetal resin, 400 parts of an epoxy resin and 400 parts of a phenol resin, and 2 parts of edible coloring matter Yellow No. 5 as a colorant was added to the mixture to obtain a thermosetting resin composition. The thermosetting resin composition was bonded to one surface of a hard aluminum foil (surface roughness average 1.6 μm, Max. 2.7 μm) having a thickness of 100 μm, to obtain a lubricant sheet for drilling which had a resin composition layer having a thickness of 100 μm (both surfaces of the lubricant sheet were apparently distinguishable from each other). Then, two 1.6 mm-thick glass epoxy copper-clad six-layered boards were stacked. The above lubricant sheet was disposed on the top surface of the stacked boards such that the resin composition layer of the lubricant sheet faced upward, and a 1.5 mm-thick paper-base-material phenol resin laminate was disposed on the lower surface of the stacked six-layered boards. Holes were made with a drill having a drill bit diameter of 0.3 mmΦ at a revolution of 80,000 rpm at a feed speed of 20 μm/rev. The holes were evaluated. Table 1 shows results thereof.

Comparative Examples 1 and 2

Lubricant sheets for drilling were prepared in the same manner as in Examples 1 and 2 except that the colorants used in Examples 1 and 2 were not used. Each of the lubricant sheets was respectively disposed on the top surface of two stacked copper-clad six-layered boards such that the aluminum foil side of the lubricant sheet faced upward. Holes were made in the same conditions as those in Examples 1 and 2. Table 1 shows evaluation results.

Comparative Example 3

Holes were made under the same conditions as in Example 1 except that the lubricant sheet for drilling used in Example 1 was not used. Table 1 shows evaluation results.

Comparative Example 4

Holes were made under the same conditions as in Example 1 except that the lubricant sheet for drilling used in Example 1 was replaced with an aluminum foil. Table 1 shows evaluation results.

TABLE 1

| Item | | Examples | | Comparative Examples | | | |
|---|---|---|---|---|---|---|---|
| | | 1 | 2 | 1 | 2 | 3 | 4 |
| Haloing (um) | | | | | | | |
| Upper surface | | 131 | 147 | 222 | 267 | 491 | 450 |
| Lower surface | | 110 | 129 | 165 | 212 | 400 | 383 |
| Smear | | | | | | | |
| 2,000 hits | average | 9.9 | 9.4 | 9.0 | 8.7 | 8.4 | 8.5 |
| | minimum | (9.4) | (8.8) | (8.5) | (8.0) | (7.3) | (7.7) |
| 5,000 hits | average | 9.3 | 8.9 | 8.4 | 8.3 | 7.7 | 8.0 |
| | minimum | (8.6) | (8.2) | (7.8) | (7.5) | (6.5) | (7.0) |
| Hole-location accuracy (Maximum μm) | | 27 | 20 | 67 | 69 | 75 | 71 |
| Roughness degree of hole wall (Maximum μm) | | 8 | 13 | 12 | 17 | 29 | 27 |

<Measurement Methods>

1) Haloing: Holes were drilled in a six-layered board by 3,000 hits and then the six-layered board was immersed in 4N-HCl at 25° C. for 5 minutes. The largest distance of haloing in a black oxide portion of an internal layer was measured.

2) Smear: Holes were drilled by 2,000 hits and 5,000 hits respectively, 10 holes drilled by 2,000 hits and 10 holes drilled by 5,000 hits were observed for their cross sections and evaluated for the generation status of smear. 10 points were given when no smear was found, and 0 point was given when smear was found over all.

3) Hole-location accuracy and Roughness degree of hole wall: After holes were drilled in two stacked six-layered boards by 3,000 hits, misregistration between a directed position of a hole location and the location of drilled hole in a back surface of the lower board of the two stacked six-layered boards was measured. Maximum values were shown. Further, concerning roughness degree of hole wall, 10 holes of the holes drilled by 3,000 hits were measured for their wall roughness, and maximum values were shown.

Example 3

35 parts of a polyethylene oxide having a molecular weight of 500,000 and 65 parts of a polyglycerin monostearate having a molecular weight of 900 were kneaded with a kneader at 130° C. under a nitrogen gas seal for 1 hour, to obtain a mixture having a viscosity of 160,000 poise. The mixture was passed through a heating roll at 130° C. to obtain a sheet having a thickness of 0.05 mm.

Separately, 10 parts of a saturated polyester resin having a hydroxyl group at a terminal and having a molecular weight of 20,000 and a melt-viscosity of 800 poise (at 200° C.) and 3 parts of hexamethylene diisocyanate were dissolved in a mixed solvent of toluene/methyl ethyl ketone=3/1, to obtain a solution having a concentration of 10% by weight. 3 parts of a blue pigment (phthalocyanine blue) which did not contain a halogen was added to the solution, and the blue pigment was uniformly dissolved and mixed in/with the solution. The resultant solution was applied to one surface of a hard aluminum foil having a thickness of 100 μm and the applied solution was dried at 100° C. for 1 hour, to form a primer layer having a thickness of 5 μm. The above-obtained sheet was placed on the primer layer of the aluminum foil, and the sheet and the aluminum foil were pressed and integrated with a heating roll to obtain a lubricant sheet for drilling, of which one surface was colored in blue (both surfaces thereof were apparently distinguishable from each other). Then, three 0.4 mm-thick BT resin copper-clad laminates were stacked. The lubricant sheet was disposed on the top surface of the stacked laminates such that the resin composition layer of the lubricant sheet faced upward, and a 1.5 mm-thick paper phenol laminate was disposed on the lower surface of the stacked laminates. Holes were made with a drill having a drill bit diameter of 0.15 mmφ at a revolution of 160,000 rpm at a feed speed of 15 μm/rev. The holes were evaluated. Table 2 shows results thereof.

Example 4

2 parts of a nonhalogen colorant having a red color (edible red No. 2) was added to 100 parts of a water-soluble polyurethane resin to obtain a resin composition. The resin composition was applied to one surface of a hard aluminum foil (surface roughness Average 1.6 μm, Max. 2.7 μm) having a thickness of 100 μm to form a resin composition layer having a thickness of 10 μm. The sheet obtained in Example 3 was placed on the resin composition layer of the aluminum foil and the sheet and the aluminum foil were bonded to each other by laminating to integrate them, whereby a lubricant sheet for drilling was prepared (both surfaces thereof were apparently distinguishable from each other). The obtained lubricant sheet was used for making holes similarly to Example 3. The holes were evaluated. Table 2 shows evaluation results.

Comparative Examples 5 and 6

Lubricant sheets for drilling were prepared in the same manners as in Examples 3 and 4 except that the colorants used in Examples 3 and 4 were not used. Each of the lubricant sheets was respectively disposed on the top surface of three stacked copper-clad laminates such that the aluminum foil side of the lubricant sheet faced upward. Holes were made in the same conditions as those in Examples 3 and 4. Table 2 shows evaluation results.

Comparative Example 4

Holes were made under the same conditions as in Example 3 except that the lubricant sheet for drilling used in Example 3 was replaced with an aluminum foil. Table 2 shows evaluation results.

TABLE 2

| Item | Examples | | Comparative Examples | | |
|---|---|---|---|---|---|
| | 3 | 4 | 5 | 6 | 7 |
| Burrs (μm) | 2 | 2 | 11 | 12 | 3 |
| Hole-location accuracy | | | | | |
| (AVG + 3σ) | 25 | 27 | 51 | 55 | 62 |
| (Maximum μm) | 27 | 29 | 77 | 72 | 75 |
| Roughness degree of hole wall (Maximum μm) | 7 | 6 | 14 | 17 | 29 |

<Measuring Method of Hole-location Accuracy>

Concerning 15,000 holes (3,000 hits×5) in a back surface of the lowest laminate of three stacked laminates, misregistration between a directed coordinate and the location of each hole was measured. Its average value+3σ and maximum value were shown.

Example 5

35 parts of a polyethylene oxide having a molecular weight of 500,000 and 65 parts of a polyglycerin monostearate having a molecular weight of 900 and 2 parts of edible coloring matter blue No. 1 as a colorant were kneaded with a kneader at 130° C. under a nitrogen gas seal for 1 hour, to obtain a mixture having viscosity of 160,000 poise. The mixture was passed through a heating roll at 130° C. to obtain a blue-colored sheet having a thickness of 0.05 mm.

Separately, both surfaces of a polyethylene terephthalate film having a thickness of 100 μm were treated by sandblasting such that the surfaces each had a roughness of 1 to 4 μm and a distance of 20-30 μm between convex portions. The above blue-colored sheet was placed on one surface of the polyethylene terephthalate film, and they were pressed and integrated with a heating roll to obtain a lubricant sheet for drilling, of which one surface was colored in blue. Then, three 0.2 mm-thick BT resin copper-clad laminates were stacked. The lubricant sheet was disposed on the top surface of the stacked laminates such that the resin composition layer of the lubricant sheet faced upward, and a 1.5 mm-thick paper phenol laminate was disposed on the lower surface of the stacked laminates. Holes were made with a drill having a drill bit diameter of 75 μmφ at a revolution of 160,000 rpm at a feed speed of 7.5 μm/rev. Then, the holes were washed with 60° C.-hot water at a high pressure. The insides of the holes were qualitatively analyzed, and it was found that no water-soluble resin remained in the insides of the holes. The holes were evaluated. Table 3 shows results thereof.

Comparative Example 8

Example 5 was repeated except that the film having a distance of 20-30 μm between convex portions used in Example 5 was replaced with a film having a distance of 60-80 μm between convex portions. Table 3 shows evaluation results.

Comparative Example 9

Example 5 was repeated except that the film used in Example 5 was replaced with a hard aluminum foil having a thickness of 100 μm. Table 3 shows evaluation results.

Comparative Example 10

Example 5 was repeated except that the lubricant sheet for drilling used in Example 5 was replaced with a polyethylene terephthalate film having a thickness of 100 μm. Table 3 shows evaluation results.

TABLE 3

| Item | Examples | Comparative Examples | | |
|---|---|---|---|---|
| | 5 | 8 | 9 | 10 |
| Breakage of drill (3,000 hits, n = 5) | Nil | Nil | 5/5 broken | 2/5 broken |
| Hole-location accuracy (Maximum μm) | 20 | 25 | — | 28 |
| Roughness degree of hole wall (Maximum μm) | 5 | 6 | — | 10 |

<Measurement Method of Hole-location Accuracy>

Concerning 15,000 holes (3,000 hits×5) in a back surface of the lowest laminate of three stacked laminates, misregistration between a directed coordinate and the location of each hole was measured. Its maximum value was shown.

What is claimed is:

1. A lubricant sheet for drilling a laminate or a plastic board, comprising
a member selected from the group consisting of a metal foil and an organic film, and
a combined layer comprising a primer layer and a lubricant resin composition layer containing at least one water-soluble resin selected from the group consisting of polyethylene oxide, polypropylene glycol and polypropylene oxide as a main component and having a thickness of 5 to 100 μm, and containing 0.1 to 5% by weight of an organic dye and/or organic pigment in at least one of the primer layer and the lubricant resin composition layer,
wherein the metal foil is a hard, soft or annealed aluminum foil having a thickness of 50 to 500 μm, or an aluminum foil which is obtained by combining these foils, and the layer is formed on one surface of the member.

2. The lubricant sheet according to claim 1, wherein the organic dye and/or organic pigment is a water-soluble organic dye and/or organic pigment.

3. The lubricant sheet according to claim 1, wherein the organic dye and/or organic pigment is a nonhalogen organic dye and/or organic pigment.

4. The lubricant sheet according to claim 1, wherein the organic film has a roughness of 0.5 to 15 μm having convex portions on a surface thereof, and a distance between the convex portions of the roughness is 1 to 50 μm.

5. The lubricant sheet according to claim 1, wherein the organic film contains a colorant.

6. A lubricant sheet for the production of a printed wiring board using the lubricant sheet of claim 1.

7. The lubricant sheet according to claim 1, wherein the lubricant resin composition layer contains the organic dye.

8. The lubricant sheet according to claim 1, wherein the primer layer contains the organic pigment and/or the organic dye.

9. A method of drilling a laminate or a plastic board, which method comprises disposing the lubricant sheet recited in claim 1 on the laminate or the plastic board, and drilling a hole from the lubricant resin composition layer side.

10. A method for production of a printed wiring board using the lubricant sheet of claim 1.

* * * * *